(12) United States Patent
Ito

(10) Patent No.: US 7,002,236 B2
(45) Date of Patent: Feb. 21, 2006

(54) SEMICONDUCTOR PACKAGE AND METHOD FOR PRODUCING THE SAME

(75) Inventor: Mutsuyoshi Ito, Kanagawa (JP)

(73) Assignee: Sony Corporation, (JP)

( * ) Notice: Subject to any disclaimer, the term of this patent is extended or adjusted under 35 U.S.C. 154(b) by 0 days.

(21) Appl. No.: 09/898,068

(22) Filed: Jul. 5, 2001

(65) Prior Publication Data

US 2002/0020916 A1 Feb. 21, 2002

(30) Foreign Application Priority Data

Jul. 7, 2000 (JP) .......................... P2000-207371

(51) Int. Cl.
*H01L 21/44* (2006.01)
*H01L 21/48* (2006.01)
*H01L 21/50* (2006.01)
*H01L 23/48* (2006.01)
*H01L 23/04* (2006.01)

(52) U.S. Cl. ...................... 257/587; 257/693; 257/698; 257/702; 257/704; 257/710; 438/118; 438/122; 438/124; 438/126; 438/612

(58) Field of Classification Search ................ 257/698, 257/702, 693
See application file for complete search history.

(56) References Cited

U.S. PATENT DOCUMENTS

| | | | | |
|---|---|---|---|---|
| 4,539,622 A | * | 9/1985 | Akasaki | .................... 156/89.21 |
| 5,237,204 A | * | 8/1993 | Val | ............................. 257/691 |
| 5,291,062 A | * | 3/1994 | Higgins, III | ................ 257/693 |
| 5,793,104 A | * | 8/1998 | Kirkman | ...................... 257/692 |
| 5,972,736 A | * | 10/1999 | Malladi et al. | ............. 257/675 |
| 6,072,122 A | * | 6/2000 | Hosoya | ..................... 174/52.2 |
| 6,333,856 B1 | * | 12/2001 | Harju | ......................... 257/723 |
| 6,359,335 B1 | * | 3/2002 | Distefano et al. | .......... 257/684 |
| 2003/0011999 A1 | * | 1/2003 | Urakawa et al. | ............ 361/728 |

OTHER PUBLICATIONS

"Land," Printed Wiring Technologies Limited, http://www-.pwtpcbs.com/glossary/land.html 4-3-3.*

* cited by examiner

Primary Examiner—David E. Graybill
(74) Attorney, Agent, or Firm—Rader, Fishman & Grauer PLLC; Ronald P. Kananen

(57) ABSTRACT

A semiconductor package in which solder balls can be loaded on an encapsulated resin to reduce the package area and a method for producing the semiconductor package. An apparatus for carrying out the method includes a first insulating substrate 5 carrying a mounting portion 3 for mounting a semiconductor device 2 and a first electrically conductive pattern 4 electrically connected to the semiconductor device 2, a sidewall section 6 formed upright around the mounting portion of the first insulating substrate, a cavity 7 defined by the first insulating substrate 5 and the sidewall section and encapsulated by an encapsulating resin 12 as the semiconductor device 2 is mounted on the mounting portion 3 and a second insulating substrate 10 provided in the cavity 7 and on the sidewall section 6 and carrying a second electrically conductive pattern 31 electrically connected to the first electrically conductive pattern 4 via plated throughholes 26 formed in the sidewall section 6. A solder land 9 is provided in a lattice on one entire surface of the second insulating substrate 10.

35 Claims, 7 Drawing Sheets

SEMICONDUCTOR PACKAGE AND METHOD FOR PRODUCING THE SAME

BACKGROUND OF THE INVENTION

1. Field of the Invention

This invention relates to a semiconductor package and a method for producing the same.

2. Description of Related Art

Up to now, as a semiconductor package, there is an area array BGA (ball grid array) 70 for surface mounting for an LSI (large scale integrated circuit) including a An solder ball terminal on its mounting surface to a printed wiring board, as shown in FIG. 1.

This BGA 70 includes a semiconductor device 73, including a first insulating substrate 72 and mounted on this first insulating substrate 72, and a second insulating substrate 75, layered via a prepreg 74 on the first insulating substrate 72, as shown in FIG.1.

The first insulating substrate 72 is a copper-lined layered plate, comprised of e.g., a glass cloth as a base, which is impregnated with an epoxy resin and on both sides of which are bonded copper foils, with the first insulating substrate 72 being formed to substantially a rectangular shape. The first insulating substrate 72 has an electrically conductive pattern 76 formed on its one surface and has a solid pattern for a heat radiation plate 77 formed on its other surface by a print etching method employing the photolithographic technique. This first insulating substrate 72 includes a mounting portion 79 mounting a semiconductor device 73 at its mid portion. On the rim of the mounting portion 79 of the first insulating substrate 72 is layered a second insulating substrate 75 having an opening 80 for mounting the semiconductor device 73 on the first insulating substrate 72 via a prepreg 74 having an opening 81. The opening 80 is formed by punching the mid portion of the second insulating substrate 75, whilst the opening 81 is formed by punching the mid portion of the prepreg 75. In the first insulating substrate 72, a cavity 82 is formed by this opening 80 and the first insulating substrate 72. On the mounting portion 79 of the first insulating substrate 72 is mounted the semiconductor device 73 with a thermally curable adhesive, such as the die bonding agent 83, through the cavity 82. The semiconductor device 73 is electrically connected with an electrically conductive pattern 76 formed in the first insulating substrate 72 and with the bonding wire 84. The cavity 82 is coated with a liquid encapsulating resin 86 and cured by a thermal process. This planarizes the upper surface of the cavity 82 which is made flush with the upper surface of the second insulating substrate 75 to enable the BGA to be mounted precisely on a motherboard.

On one surface of the second insulating substrate 75, layered on the first insulating substrate 72, there is lined a copper foil which is patterned by a print etching method employing the photolithographic technique to form solder lands 88 and an electrically conductive pattern 89 electrically connecting the solder lands 88. Plural such solder lands 88 are formed around the opening 80 on one surface of the second insulating substrate 75.

In the, second insulating substrate 75, a plated through-hole 91 is bored for extending from the upper surface of the second insulating substrate 75 up to the lower surface of the first insulating substrate 72. Thus, the electrically conductive pattern 89, formed on the second insulating substrate 75, the electrically conductive pattern 76 formed on the first insulating substrate and the solid pattern for the heat radiation plate 77 formed on the other surface of the first insulating substrate are electrically connected via the through-hole 91. With the BGA 70, plural solder balls 92 are formed by printing cream solder on each solder land 88.

On the surface of the first insulating substrate 72 carrying the solid pattern for the heat radiation plate 77, there is bonded a heat radiating plate 93 via an adhesive. This permits heat occasionally stored in the BGA 70 to be dissipated through the heat radiating plate 93 to prevent overheating of the BGA 70.

The BGA 70 is mounted on the motherboard by the solder balls 92 formed on the upper surface of the second insulating substrate 75 to be electrically connected to the electrically conductive layer formed on the motherboard.

Meanwhile, in an electrical equipment, required to be reduced in size and weight, the BGA, enclosed therein, needs to be reduced in size. However, in a package in which an area for a cavity 82 coated with a sealed resin 86 and an area of the second insulating substrate 75, the solder balls 92 and the conductor pattern may be provided solely on the upper side of the second insulating substrate 75, while they cannot be provided on the cavity 82, thus increasing the package area. Moreover, since the function of the solder balls and the conductor patterns provide for electrical connection between the semiconductor package and the motherboard, limitations are imposed on reducing. the mounting area to render it difficult to reduce the package size.

SUMMARY OF THE INVENTION

It is therefore an object of the present invention to provide a semiconductor package capable of loading solder balls on the encapsulating resin to reduce the package size and a method for the preparation of the semiconductor package.

In one aspect, the present invention provides a semiconductor package including a first insulating substrate carrying a mounting portion for mounting a semiconductor device and a first electrically conductive pattern electrically connected to the semiconductor device, a sidewall section formed upright around the mounting portion of the first insulating substrate, a cavity defined by the first insulating substrate and the sidewall section and encapsulated by resin as the semiconductor device is mounted on the mounting portion and a second insulating substrate provided in the cavity and on the sidewall section and carrying a second electrically conductive pattern electrically connected to the first electrically conductive pattern via through-holes formed in the sidewall section. A solder land is provided at least in the cavity on one surface of the first insulating substrate.

In another aspect, the present invention provides a method for the preparation of a semiconductor package comprising the steps of forming a mounting portion for mounting a semiconductor device and a first electrically conductive pattern for electrically connecting the semiconductor device on a first insulating substrate, layering a spacer having an opening of substantially the same size as the mounting portion in one surface of the first insulating substrate, mounting a semiconductor device in the mounting portion defined by the first insulating substrate and the opening provided in the spacer, encapsulating the cavity with encapsulating resin after mounting the semiconductor device in the mounting portion, layering a second insulating substrate carrying the electrically conductive layer on one surface thereof on the spacer, forming a through-hole for establishing electrical connection between the first electrically conductive pattern and the electrically conductive layer, and forming a solder land at least in the cavity in the electrically conductive layer.

In the semiconductor package and the method for the preparation thereof, according to the present invention, in which the electrical wiring can be provided on the resin-encapsulated area of the resin-encapsulated semiconductor device, it is possible to have the solder balls for conduction and connection between the BGA and the motherboard as a portion of the wiring mounted on the resin-encapsulated area of the resin-encapsulated semiconductor device. The result is that the resin-encapsulated cavity represents an effective area in mounting the BGA on the motherboard. Consequently, the semiconductor package is not increased in area so that it is possible to provide a small-sized semiconductor package with high heat radiation.

DESCRIPTION OF THE PREFERRED EMBODIMENTS

Figure 1:
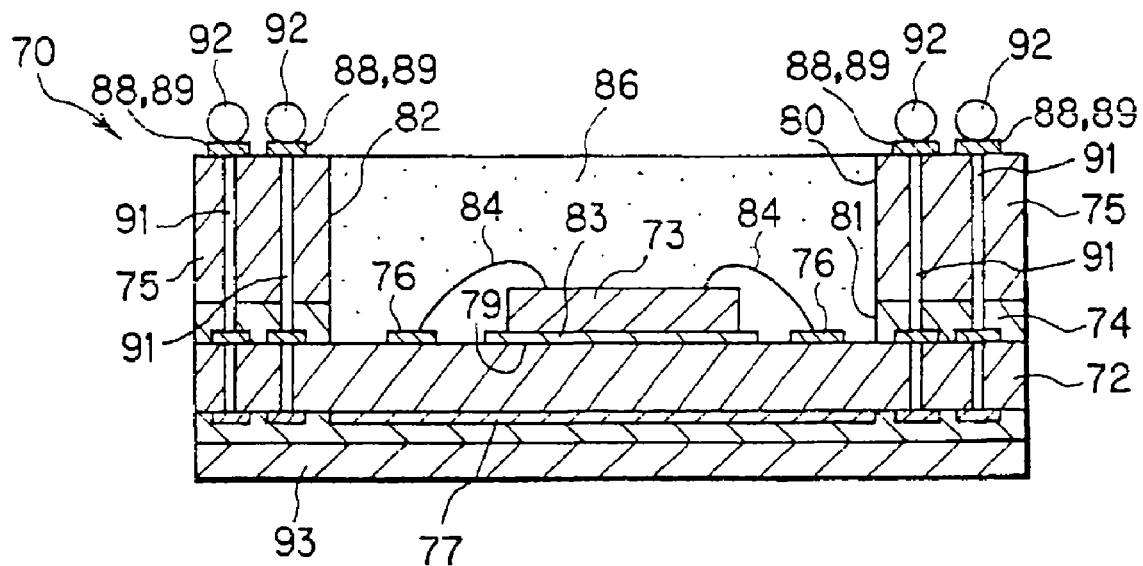
FIG. 1 is a cross-sectional view showing a conventional BGA.
Figure 2:
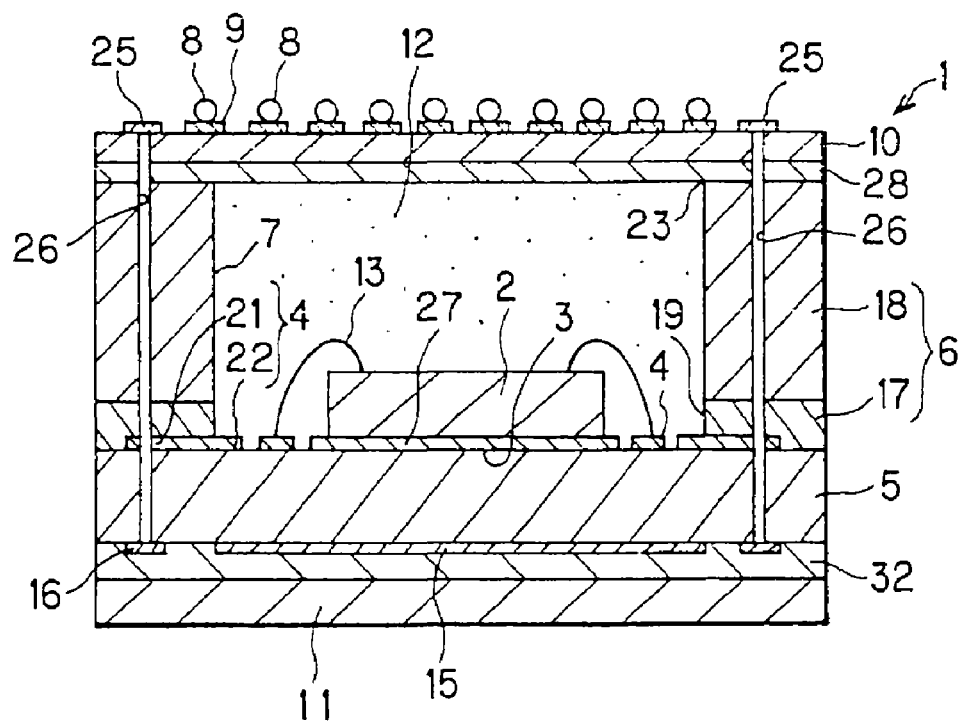
FIG. 2 is a cross-sectional view showing a BGA embodying the present invention.
Figure 3:
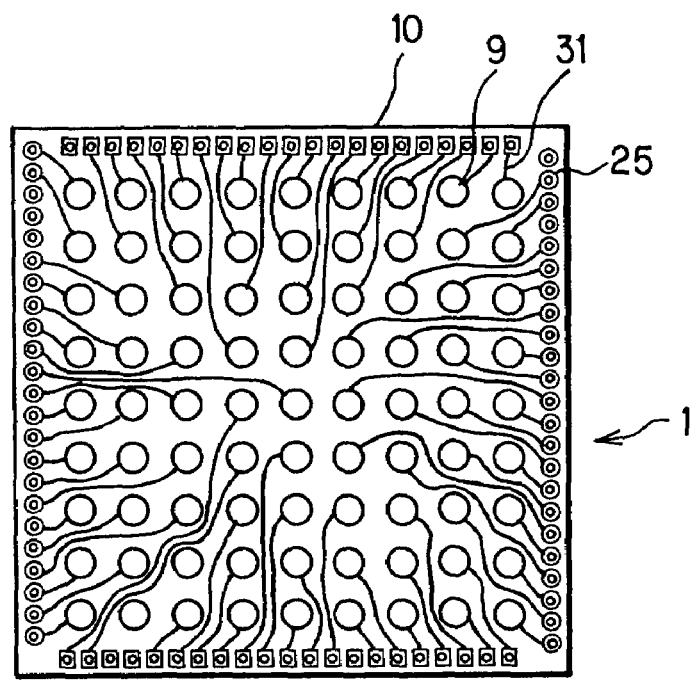
FIG. 3 is a plan view showing a BGA embodying the present invention.
Figure 4:
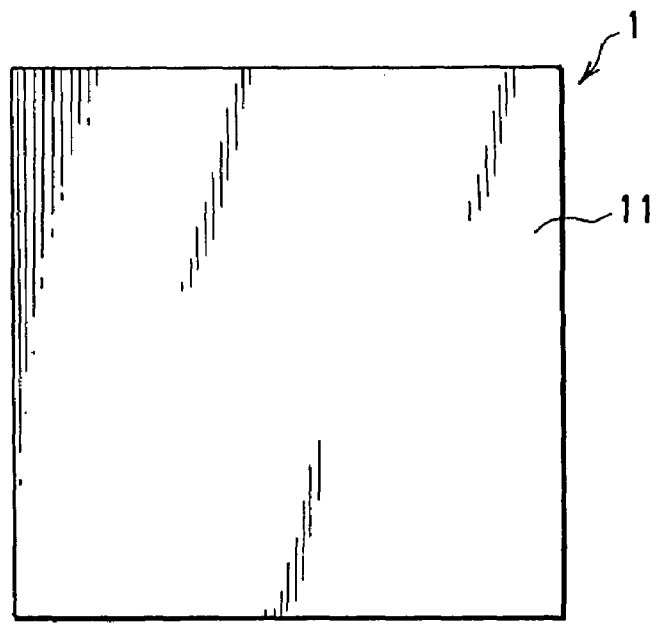
FIG. 4 is a bottom plan view of a BGA embodying the present invention.

Referring to the drawings, a BGA to which is applied a semiconductor package embodying the present invention will be explained in detail. FIGS. 2 to 4 show a BGA embodying the present invention. This BGA 1 is an area array type package for surface. mounting an LSI on one entire surface of which plural solder lands are arranged in a lattice. This BGA 1 includes a first insulating substrate 5, having mounted thereon a semiconductor device 2 and having formed thereon an electrically conductive pattern 4, a sidewall section 6 formed upright around a mounting portion 3, a cavity 7 defined by the first insulating substrate 5 and the sidewall section 6, a second insulating substrate 10 on which to form solder lands 9, and a heat radiating plate 11 for preventing overheating of the BGA 1. Within the cavity 7 of the BGA 1 is mounted the semiconductor device 2 and charged an encapsulating resin 12.

The first insulating substrate 5, on which is loaded the semiconductor device 2, is a substantially recording copper-lined laminated plate comprised of a glass cloth as a base material impregnated with an epoxy resin. On both sides of the first insulating substrate 5 are stuck copper foils. The first insulating substrate 5 is patterned by a print etching method employing the photolithographic technique, whereby an electrically conductive pattern 4 for electrically connecting the mounting portion 3 for mounting the semiconductor device 2 to the semiconductor device 2 mounted around the mounting portion 3 is formed on its one surface. In similar manner, a heat dissipating pattern 15 for radiating the heat from within the package through a heat radiating plate 11 and a land 16 for the through-hole are formed in the first insulating substrate 5.

The mounting portion 3, on which to mount the semiconductor device 2, is provided at a mid portion of the first insulating substrate 5. The semiconductor device 2 is mounted on the mounting portion 3 using an adhesive, such as a die bond, as later explained. The electrically conductive pattern 4, formed around the mounting portion 3, is made up of a land 21 formed continuously around the rim of one surface of the first insulating substrate 5 and patterns 22 formed towards the mounting portion 3 from the land 21 so as to be electrically connected to a bonding wire 13 as later explained. In the land 21 is formed a plated through-hole 26, which will be explained subsequently.

On the other surface of the first insulating substrate 5 is formed a solid pattern for a heat radiation plate 15 to a substantially square shape beginning from the center towards the rim of the first insulating substrate 5. A through-hole land 16, passed through by the plated through-hole 26, is provided around the solid pattern for a heat radiation plate 15.

The sidewall section 6, formed upright around the first insulating substrate 5, is made up of the prepreg 17 and a spacer substrate 18 layered on the prepreg 17.

The prepreg 17, which unifies the spacer substrate 18 and the first insulating substrate 5 together, has a substantially square-shaped center opening 19 substantially coextensive as the mounting portion 3, and is formed to substantially a square shape of the same size as that of the first insulating substrate 5. This prepreg 17 is layered on the land 21 around the rim of the first insulating substrate 5 and operates as an adhesive layer for the spacer substrate 18 and the first insulating substrate 5. Similarly to the prepreg 17, the spacer substrate 18 has a substantially square-shaped center opening 23 substantially coextensive as the mounting portion 3, and is formed to substantially a square shape of the same size as that of the first insulating substrate 5. This spacer substrate 18 is layered through the prepreg 17 around the rim of the first insulating substrate 5. This forms the cavity 7 of a depth sufficient to hold the semiconductor device 2 in an area surrounded by the sidewall section 6. The cavity 7 exposes the mounting portion 3 provided on the first insulating substrate 5 to outside.

In the sidewall section 6, there are formed plural plated through-holes 26 for extending in the upstanding direction of the sidewall section 6 so as to be passed through an area between a through-hole land 25 formed in continuation to the rim of the layered second insulating substrate 10 and the land 21 formed in continuation on the rim of the first insulating substrate 5.

On the mounting portion 3 provided in the first insulating substrate 5, exposed to outside through the cavity 7 formed in the first insulating substrate 5, a chip-shaped semiconductor device 2 carrying a pre-set electrical circuit is mounted with a thermosetting adhesive, for example, a die-bond agent 27. The semiconductor device 2 and the patterns 22 of the electrically conductive pattern 4 formed on the first insulating substrate 5 are electrically connected to each other by the bonding wire. The cavity 7, accommodating the semiconductor device 2 therein, is charged with the encapsulating resin 12 so that its upper surface is flush with the sidewall section 6. The encapsulating resin 12 is a liquid thermosetting resin and is cured on heat treatment. This planarizes the upper surface of the BGA 1 to permit the second insulating substrate 10 to be layered positively thereon.

The second insulating substrate 10, layered on the upper surface of the spacer substrate 18, is comprised of a copper-lined layered plate comprised of a glass cloth impregnated with an epoxy resin and on one surface of which is bonded a copper foil. This second insulating substrate 10 is patterned to form solder lands 9, forming solder balls 8, through-hole lands 25 formed with the plated through-holes 26 and a conductor pattern 31 electrically interconnecting the solder lands 9 and the through-hole lands 25 by a print etching method employing the photolithographic technique. The second insulating substrate 10 is layered on the sidewall section 6 and on the cavity 7 through the prepreg 28 so that its patterned surface-faces outwards.

The solder lands 9 are formed as a lattice on the entire surface of the second insulating substrate 10. On the solder lands 9, solder balls 9 for providing for interconnection between the motherboard and the BGA 1 are formed by printing and reflow of a solder cream.

On the opposite side of the first insulating substrate 5 is formed the heat radiating plate 11 for radiating the heat of the BGA I to outside to prevent overheating of the BGA 1. The heat radiating plate 11 is bonded, with an adhesive 32, to the solid pattern for a heat radiation plate 15 and to the through-hole lands 16 formed on one surface of the first insulating substrate 5. Thus, in the BGA 1, the heat within the package can be dissipated through the heat radiating plate 11 to outside to prevent malfunctions otherwise caused by overheating.

The BGA 1 is connected to the motherboard by reflow soldering with the solder balls 8 mounted on the second insulating substrate 10 compressing against the mounting surface on the motherboard. This electrically connects the BGA 1 to the motherboard through the solder balls 8 formed on the second insulating substrate 10, conductor pattern 31 and the plated through-holes 26.

With the BGA according to the present invention, in which the wiring can be made on an upper portion of the resin encapsulated area of the resin-encapsulated semiconductor device, the solder balls 8 for providing for electrical interconnection between the BGA 1 and the motherboard as part of the wiring can be installed in the encapsulated area of the semiconductor device 2 of the BGA 1. Consequently, the resin-encapsulated cavity represents an area effective for mounting, without proving a dead space in connecting the BGA to the motherboard. So, the package area is not increased to realize a small-sized high heat dissipating BGA.

Figure 5:
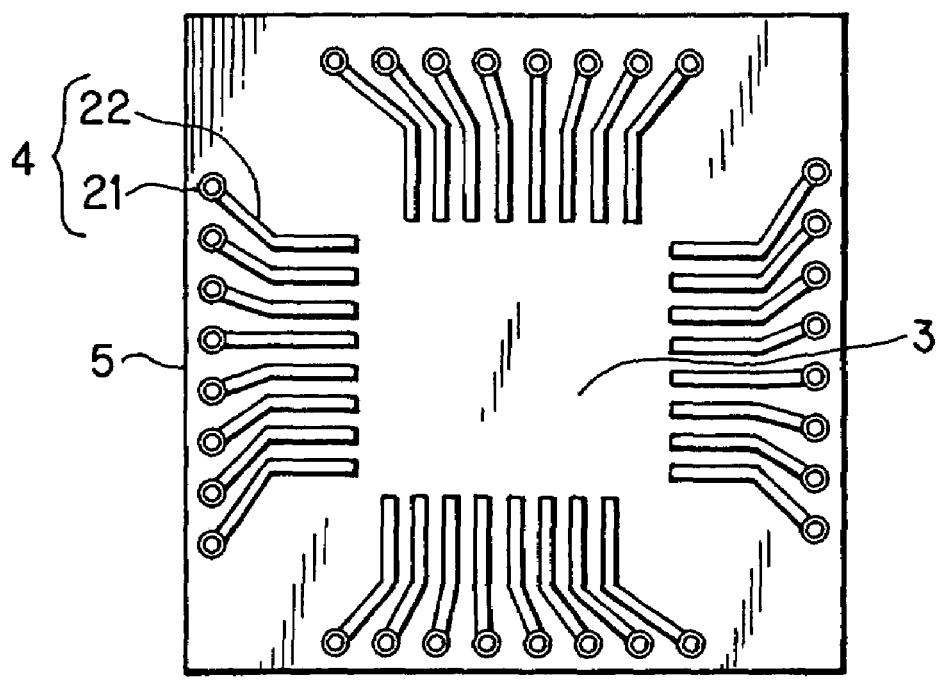
FIG. 5 is a plan view showing an insulating substrate carrying a land and a conductor pattern.

The above-described BGA 1 can be prepared as follows:

First, copper foils are bonded to both sides of a glass cloth impregnated with the epoxy resin to form the first insulating substrate 5 comprised of copper-lined laminated sheets. Then, as shown in FIG. 5, the first insulating substrate 5 is formed to a substantially rectangular form. Using a photo film, having printed thereon a pattern registering with the lands 21 and the patterns 22, one surface of the first insulating substrate 5 is patterned by a print etching method employing the photolithographic technique. This forms the electrically conductive pattern 4, comprised of the lands 21, formed for extending along the rim of the first insulating substrate 5, and the patterns 22, formed for extending from these lands 21 to the mounting portion 3 formed at a mid portion of the first insulating substrate 5. The opposite side of the first insulating substrate 5 is lined in its entirety with a copper pattern,20.

In a similar manner, the substantially recording prepreg 17 and the spacer substrate 18 are formed and mid portions of the prepreg 17 and the spacer substrate 18. are punched off to form the openings 19, 23.

Figure 6:
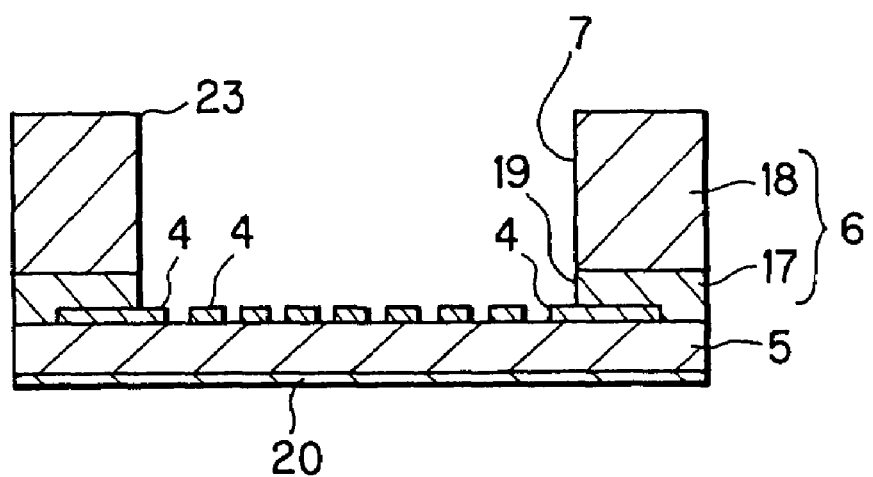
FIG. 6 is a cross-sectional view showing the manner in which a prepreg and an Insulating substrate are layered on the insulating substrate to form a sidewall section.
Figure 7:
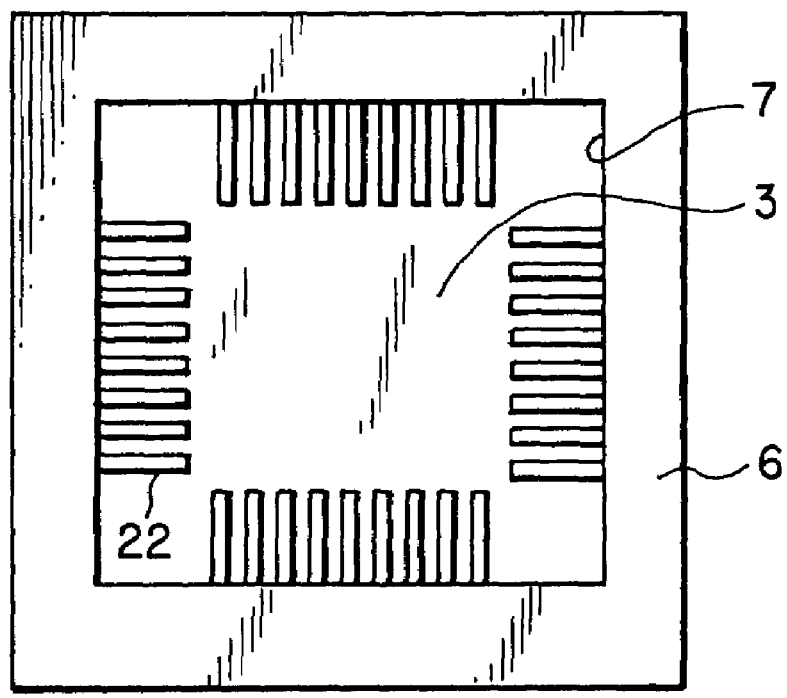
FIG. 7 is a plan view showing an insulating substrate carrying a sidewall section.

Then, as shown in FIGS. 6 and 7, the spacer substrate 18 of the same size as the first insulating substrate 5 is layered over the lands 21 through the spacer substrate 18 and unified to the first insulating substrate 5 by vacuum hot pressing to form the sidewall section 6. The cavity 7 then is formed by the sidewall section 6 being formed on its rim.

Figure 8:
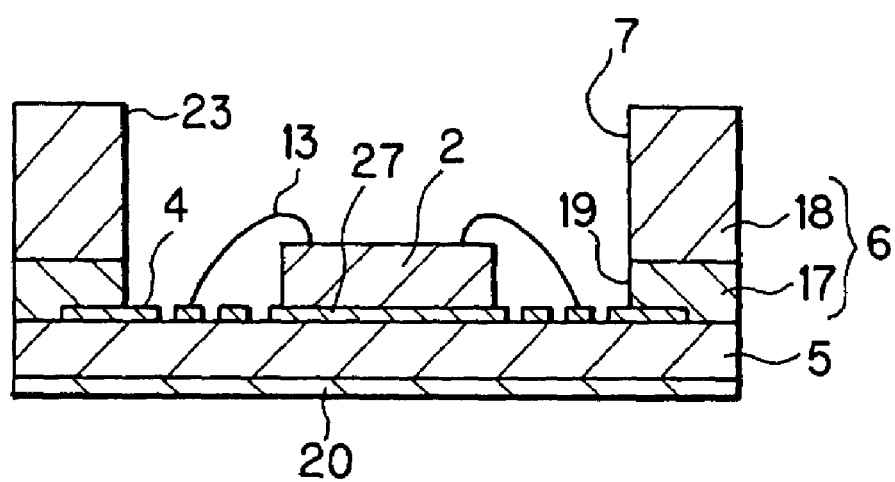
FIG. 8 is a cross-sectional view showing the manner of loading a semiconductor device in a cavity.
Figure 9:
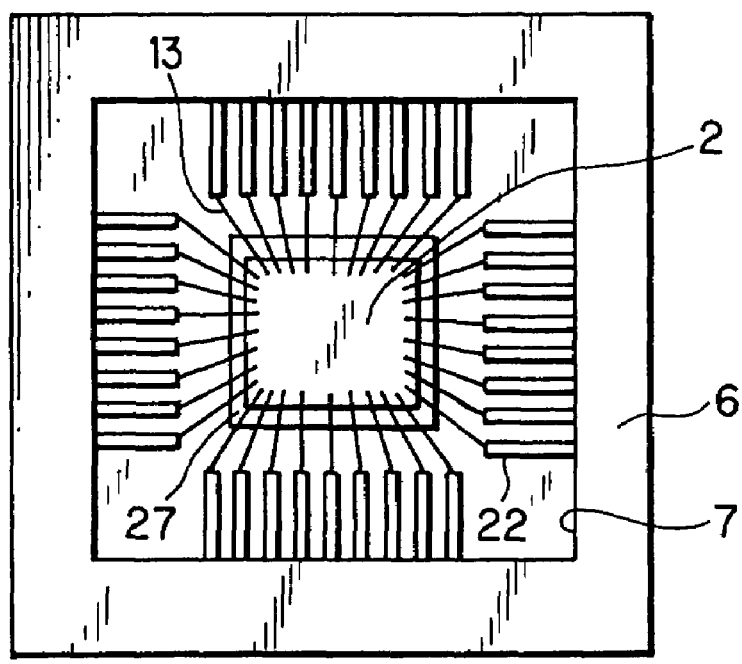
FIG. 9 is a plan view showing the manner of connecting a semiconductor device to a conductor pattern by a bonding wire.

The semiconductor device 2, carrying the electrical circuitry, is loaded in the cavity 7, as shown in FIG. 8. This semiconductor device 2 is loaded on the mounting portion 3, formed at a mid portion of the first insulating substrate 5, through an adhesive, such as a die bond 27. The semiconductor device 2 then is wired with the bonding wire by a wire bonding device, not shown.

Figure 10:
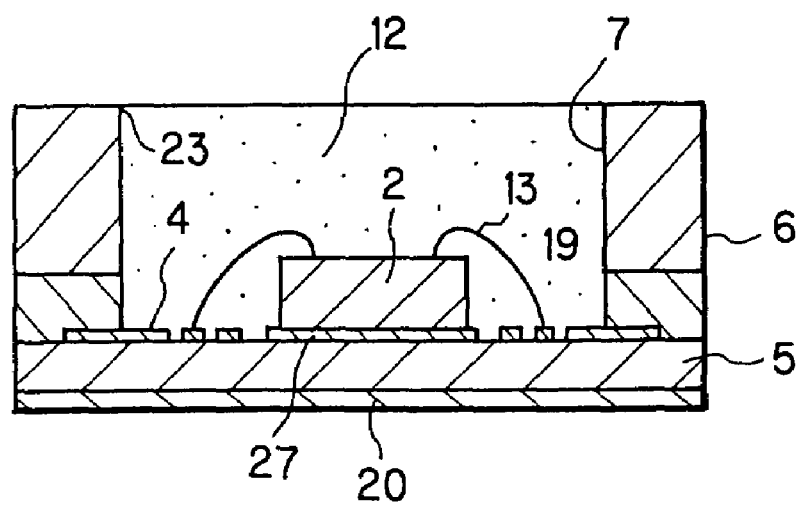
FIG. 10 is a cross-sectional view showing an encapsulating resin in a cavity accommodating a semiconductor device therein.

Then, as shown in FIG. 10, the liquid encapsulating resin 12 is applied to the cavity 7 accommodating the semiconductor device 2. This encapsulating resin 12 is the thermosetting resin, such as epoxy, melamine, phenol or urea, and is cured by a heat treatment process, not shown. In this manner, the encapsulated. area of the semiconductor device 2 of the BGA 1 is made substantially flush with the upper surface of the sidewall section 6. Meanwhile, in the BGA 1, the upper surface of the sidewall section 6 is made flush with the encapsulated area by appropriately polishing the upper surface of the sidewall section 6 or the cured encapsulating resin 12.

The second insulating substrate 10 of the same size as the first insulating substrate 5 then is layered to cover the sidewall section 6 and an area coated with the encapsulating resin 12. This second insulating substrate 10 is a laminated sheet, lined with copper on its one surface. Specifically, the second insulating substrate 10 is a glass cloth, impregnated with the epoxy resin, one surface of which is lined with a copper foil. The second insulating substrate 10 is layered via a prepreg 28 of the same size as the first insulating substrate 5, with a surface lined with the copper foil facing outwards, and unified to the first insulating substrate 5 on vacuum hot pressing.

Figure 11:
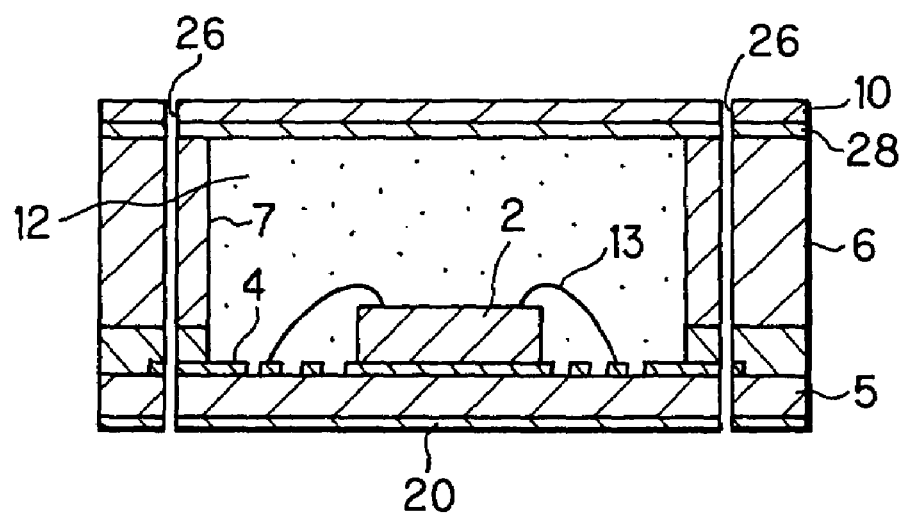
FIG. 11 is a cross-sectional view showing the manner of layering insulating substrates for forming a plated through-hole in the insulating plate, sidewall section and in the insulating substrate.
Figure 12:
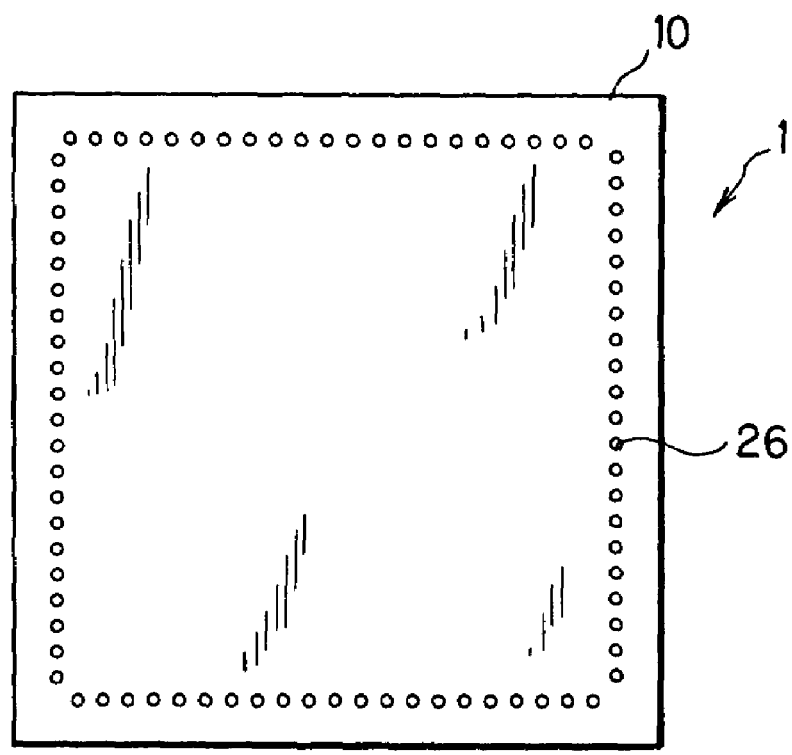
FIG. 12 is a plan view showing the insulating plate shown in FIG. 11.

Then, as shown in FIGS. 11 and 12, a series of through-holes traversing both sides of the sidewall section 6 and the first insulating substrate 5 are formed for extending along the rim of the second insulating substrate 10, using an NC ball lathe. These through-holes are deburred by desmearing such as sulfuric acid method, chromic acid method or the plasma method. The through-holes 26 then are plated by electrolytic plating or non-electrolytic plating to form the plated through-holes 26. These through-holes 26, traversing the lands 21 formed in the first insulating substrate 5, provide for interconnection of the electrically conductive pattern 4 formed on the first insulating substrate 5, the second insulating substrate 10 and the copper pattern 20 deposited on the opposite surface of the first insulating substrate 5.

Figure 13:
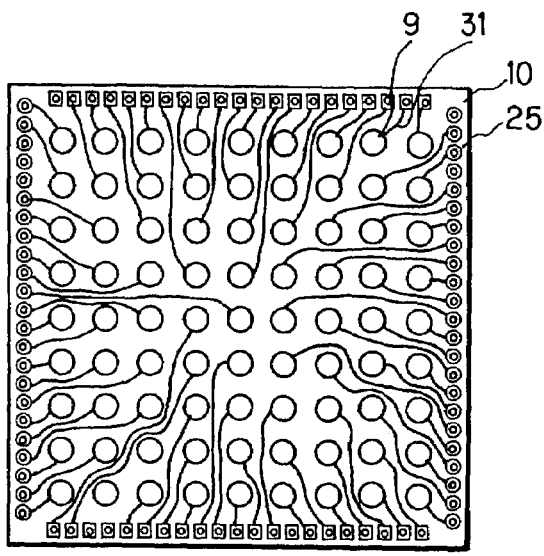
FIG. 13 is a plan view showing the manner of forming a through-hole land, a solder land and a conductor pattern in the insulating plate.

En The second insulating substrate 10 then is patterned to form the solder lands 9, through-hole lands 25 and the conductor patterns 31 on its surface carrying the copper foil by a print etching method employing the photolithographic technique with the aid of the photo film carrying the solder lands 9, through-hole lands 25 and the conductor patterns 31 interconnecting the solder lands 9 and the through-hole lands 25, as shown in FIG. 13. The through-hole lands 25 are formed so that the plated through-holes,26 formed in succession along the rim of the second insulating substrate 10 will be at the center of the lands, as shown in FIG. 13. These solder lands 9 and the through-hole lands 25 are connected to each other each by a sole conductor pattern 31.

Figure 14:
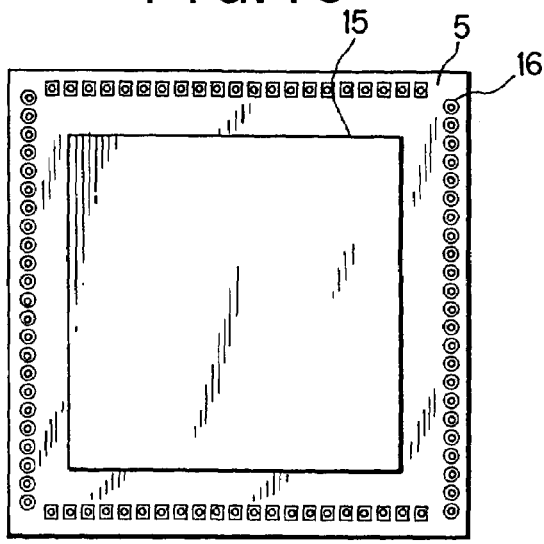
FIG. 14 is a bottom plan view showing a BGA carrying a solid pattern for a heat radiation plate.

In similar manner, a series of the through-hole lands 16 are formed along the solid pattern for a heat radiation plate 15 and the first insulating substrate 5 in the copper pattern 20 formed on the opposite surface of the first insulating substrate 5, as shown in FIG. 14. Similarly to the through-hole lands 25, the through-hole lands 16 are formed so that the plated through-holes 26 will be at the center of the lands. The solid pattern for a heat radiation plate 15 is formed to substantially a square shape extending from the center towards the rim.

Figure 15:
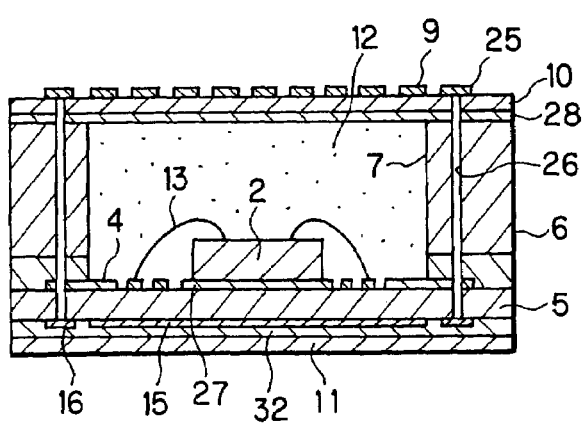
FIG. 15 is a cross-sectional view showing the BGA to which is bonded the hear radiating plate.

On the opposite surface of the first insulating substrate 5, the heat radiating plate 11 is affixed, via an adhesive 32, to overlie the through-hole lands 16 and the solid pattern for the heat radiation plate 15, as shown in FIG. 15. This heat radiating plate is of the same size as the first insulating substrate 5. In this manner, the BGA 1 is able to dissipate the heat in the package to outside through the heat radiating plate 11 to prevent malfunctions otherwise produced by overheating.

Then, as shown in FIGS. 2 and 3, the solder balls 8 for interconnecting the BGA 1 to the motherboard are loaded on the solder lands 9, using a solder ball mounter or a reflow furnace, not shown, to complete the BGA 1, as shown in FIGS. 2 and 3.

With the above-described manufacturing method for the BGA, since the wiring can be formed on top of the resin encapsulating area of the resin-encapsulated semiconductor device, the solder balls 8 providing for connection between the BGA 1 and the motherboard can be installed in the encapsulating area of the resin-encapsulated semiconductor device 2. So, the encapsulated cavity portion represents an area effective for mounting without proving a dead space for the connection of the BGA to the motherboard, so that the package area is not increased to provide a small-sized BGA with high heat radiation.

Meanwhile, the various conductor patterns formed in the first insulating substrate 5 and in the second insulating substrate 10 can be formed by any known suitable printing method, such as screen printing method, in addition to the print etch method employing the photolithographic technique.

What is claimed is:

1. A semiconductor package comprising:
    a first insulating substrate having a first surface and a second surface opposite said first surface, said first surface having electrically conductive patterns and electrically conductive pattern lands formed thereon, said second surface having a heat dissipating pattern and second surface lands formed thereon;
    a heat radiating plate that radiates heat from within said semiconductor device, said heat dissipating pattern and said second surface lands being between said first insulating substrate and said heat radiating plate;
    a semiconductor device bonded onto said first surface, bond wires connecting said semiconductor device to said electrically conductive patterns, said electrically conductive patterns being connected to said electrically conductive pattern lands;
    a sidewall section on said first surface, said sidewall section encircling said semiconductor device, a cavity being a concave shape defined by said first insulating substrate and said sidewall section, said semiconductor device being contained within said cavity;
    a second insulating substrate covering said sidewall section and said cavity, said second insulating substrate having a through-hole land portion and a solder land portion, said through-hole land portion being disposed at the rim of said second insulating substrate to contact said sidewall section, and a solder land portion being disposed at the central part of said second insulating substrate to contact said cavity;
    through-hole lands disposed at said through-hole land portion;
    solder lands disposed at said solder land portion;
    conductor patterns connecting said solder lands to said through-hole lands; and
    through-holes extending from said through-hole lands, through said second insulating substrate, said sidewall section, said electrically conductive pattern lands, said first surface, and said second surface, to said second surface lands, said through-holes being plated to form plated through-holes.

2. A semiconductor package according to claim 1 wherein said through-hole lands and said solder lands are on a surface of said second insulating substrate.

3. A semiconductor package according to claim 1 wherein said through-hole lands contact said plated through-holes.

4. A semiconductor package according to claim 1 wherein an adhesive between said first insulating substrate and said heat radiating plate bonds said first insulating substrate to said heat radiating plate.

5. A semiconductor package according to claim 1 wherein said semiconductor device is bonded onto said first surface using a thermosetting adhesive.

6. A semiconductor package according to claim 1 wherein said first insulating substrate comprises a glass cloth impregnated with an epoxy resin.

7. A semiconductor package according to claim 1 wherein said second insulating substrate comprises a glass cloth impregnated with an epoxy resin.

8. A semiconductor package according to claim 1 wherein said electrically conductive patterns are disposed circumferentially about said semiconductor device.

9. A semiconductor package according to claim 1 wherein said sidewall section includes a prepreg layer and a spacer substrate.

10. A semiconductor package according to claim 1 wherein a prepreg layer is disposed between said second insulating substrate and said sidewall section.

11. A semiconductor package according to claim 1 wherein said first insulating substrate is a laminated sheet lined with copper on said first and second surfaces, said copper on said first surface forming said electrically conductive patterns and said electrically conductive pattern lands, said copper on said second surface forming said through-hole lands and said solder lands.

12. A semiconductor package according to claim 1 wherein said solder lands are formed on second insulating substrate as a lattice.

13. A semiconductor package according to claim 1 wherein one of said solder lands is interconnected to only one of said through-hole lands.

14. A semiconductor package according to claim 13 wherein said through-hole lands are disposed only at said through-hole land portion.

15. A semiconductor package according to claim 1 wherein an encapsulating resin encases said semiconductor device.

16. A semiconductor package according to claim 15 wherein said encapsulating resin fills said cavity.

17. A semiconductor package according to claim 15 wherein said encapsulating resin is co-planar with said sidewall section.

18. A semiconductor package according to claim 17 wherein said encapsulating resin is planarized.

19. A method for the preparation of a semiconductor package comprising the steps of:
    forming electrically conductive patterns and electrically conductive pattern lands on a first surface of a first insulating substrate;
    forming a heat radiating plate that radiates heat from within said semiconductor device, a heat dissipating pattern and second surface lands being between said first insulating substrate and said heat radiating plate;
    bonding a semiconductor device onto said first surface;
    connecting said semiconductor device to said electrically conductive patterns with bond wires;
    connecting said electrically conductive patterns to said electrically conductive pattern lands;
    encircling said semiconductor device with a sidewall section to form a cavity, said sidewall section being formed on said first surface, said cavity being a concave shape defined by said first insulating substrate and said sidewall section, said semiconductor device being contained within said cavity;
    covering said sidewall section and said cavity with a second insulating substrate, said second insulating substrate having a through-hole land portion and a solder land portion, said through-hole land portion being disposed at the rim of said second insulating substrate to contact said sidewall section, and a solder land portion being disposed at the central part of said second insulating substrate to contact said cavity;
    extending through-holes through said second insulating substrate, said sidewall section, said electrically conductive pattern lands, said first surface, and said second surface, to said second surface lands, said through-holes being plated to form plated through-holes;
    forming through-hole lands at said through-hole land portion, said through-hole lands contacting said plated through-holes;
    forming solder lands at said solder land portion; and
    connecting said solder lands to said through-hole lands with conductor patterns.

20. A method for the preparation of a semiconductor package according to claim 19 wherein said through-hole lands and said solder lands are formed on a surface of said second insulating substrate.

21. A method for the preparation of a semiconductor package according to claim 19 further comprising the step of:
    forming an adhesive between said first insulating substrate and said heat radiating plate to bond said first insulating substrate to said heat radiating plate.

22. A method for the preparation of a semiconductor package according to claim 19 further comprising the step of:
    bonding said semiconductor device onto said first surface using a thermosetting adhesive.

23. A method for the preparation of a semiconductor package according to claim 19 wherein said first insulating substrate comprises a glass cloth impregnated with an epoxy resin.

24. A method for the preparation of a semiconductor package according to claim 19 wherein said second insulating substrate comprises a glass cloth impregnated with an epoxy resin.

25. A method for the preparation of a semiconductor package according to claim 19 wherein said electrically conductive patterns are disposed circumferentially about said semiconductor device.

26. A method for the preparation of a semiconductor package according to claim 19 wherein said sidewall section includes a prepreg layer and a spacer substrate.

27. A method for the preparation of a semiconductor package according to claim 19 wherein a prepreg layer is disposed between said second insulating substrate and said sidewall section.

28. A method for the preparation of a semiconductor package according to claim 19 wherein said first insulating substrate is a laminated sheet lined with copper on said first and second surfaces, said copper on said first surface forming said electrically conductive patterns and said electrically conductive pattern lands, said copper on said second surface forming said through-hole lands and said solder lands.

29. A method for the preparation of a semiconductor package according to claim 19 wherein said solder lands are formed on second insulating substrate as a lattice.

30. A method for the preparation of a semiconductor package according to claim 19 wherein one of said solder lands is interconnected to only one of said through-hole lands.

31. A method for the preparation of a semiconductor package according to claim 30 wherein said through-hole lands are disposed only at said through-hole land portion.

32. A method for the preparation of a semiconductor package according to claim 19 further comprising the step of: encasing said semiconductor device with an encapsulating resin.

33. A method for the preparation of a semiconductor package according to claim 32 wherein said encapsulating resin fills said cavity.

34. A method for the preparation of a semiconductor package according to claim 32 further comprising the step of:
    planarizing said encapsulating resin.

35. A method for the preparation of a semiconductor package according to claim 32 wherein said encapsulating resin is co-planar with said sidewall section.

* * * * *